US007862678B2

(12) United States Patent
Andrews et al.

(10) Patent No.: US 7,862,678 B2
(45) Date of Patent: Jan. 4, 2011

(54) DROP GENERATOR

(75) Inventors: John R. Andrews, Fairport, NY (US); Jim Stevenson, Tualatin, OR (US); Bradley J. Gerner, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 872 days.

(21) Appl. No.: 11/398,148

(22) Filed: Apr. 5, 2006

(65) Prior Publication Data

US 2007/0236543 A1 Oct. 11, 2007

(51) Int. Cl.

| | |
|---|---|
| ***B29C 65/00*** | (2006.01) |
| *C09J 5/00* | (2006.01) |
| *B65C 9/25* | (2006.01) |
| *H03M 7/12* | (2006.01) |
| *C23F 3/00* | (2006.01) |
| *C03C 15/00* | (2006.01) |
| *B31D 3/00* | (2006.01) |

(52) U.S. Cl. ....................... 156/250; 156/251; 156/267; 156/268; 156/305; 156/311; 156/322; 216/33; 216/41; 216/56; 216/77; 347/71

(58) Field of Classification Search .................. 347/71; 156/250; 216/77, 33, 41, 56
See application file for complete search history.

(56) References Cited

U.S. PATENT DOCUMENTS

| | | | | |
|---|---|---|---|---|
| 3,723,223 | A * | 3/1973 | Le Compte | 156/313 |
| 4,730,197 | A | 3/1988 | Raman et al. | |
| 4,897,903 | A * | 2/1990 | Johannsen | 29/25.35 |
| 5,714,078 | A | 2/1998 | Thiel | |
| 6,109,737 | A * | 8/2000 | Kishima | 347/70 |
| 2004/0117960 | A1* | 6/2004 | Kelley et al. | 29/25.35 |
| 2005/0045272 | A1* | 3/2005 | McGlothlan | 156/267 |

OTHER PUBLICATIONS

European Search Report; dated Jul. 7, 2007 for EP Appln. No. 07 10 5634.5-1251; 9 pages; The Hague.

* cited by examiner

*Primary Examiner*—Philip C Tucker
*Assistant Examiner*—Alex Efta
(74) *Attorney, Agent, or Firm*—Fay Sharpe LLP

(57) ABSTRACT

A method for making a plurality of electromechanical devices including attaching a laminar electromechanical structure to a receiving substrate using a not appreciably cured adhesive in a liquid state, laser cutting the laminar electromechanical structure while the adhesive is not appreciably cured to form a plurality of electromechanical devices, and curing the adhesive.

17 Claims, 3 Drawing Sheets

DROP GENERATOR

BACKGROUND

The subject disclosure is generally directed to drop emitting apparatus including, for example, drop jetting devices.

Drop on demand ink jet technology for producing printed media has been employed in commercial products such as printers, plotters, and facsimile machines. Generally, an ink jet image is formed by selective placement on a receiver surface of ink drops emitted by a plurality of drop generators implemented in a printhead or a printhead assembly. For example, the printhead assembly and the receiver surface are caused to move relative to each other, and drop generators are controlled to emit drops at appropriate times, for example by an appropriate controller. The receiver surface can be a transfer surface or a print medium such as paper. In the case of a transfer surface, the image printed thereon is subsequently transferred to an output print medium such as paper.

DETAILED DESCRIPTION

Figure 1:
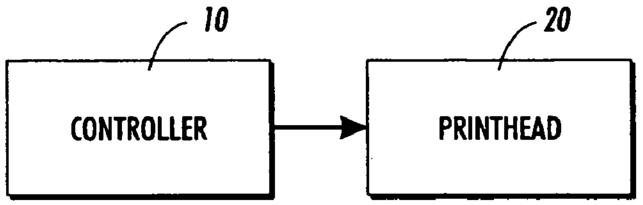
FIG. 1 is a schematic block diagram of an embodiment of a drop-on-demand drop emitting apparatus.

FIG. 1 is a schematic block diagram of an embodiment of a drop-on-demand printing apparatus that includes a controller 10 and a printhead assembly 20 that can include a plurality of drop emitting drop generators. The controller 10 selectively energizes the drop generators by providing a respective drive signal to each drop generator. Each of the drop generators can employ a piezoelectric transducer. As other examples, each of the drop generators can employ a shear-mode transducer, an annular constrictive transducer, an electrostrictive transducer, an electromagnetic transducer, or a magnetorestrictive transducer. The printhead assembly 20 can be formed of a stack of laminated sheets or plates, such as of stainless steel.

Figure 2:
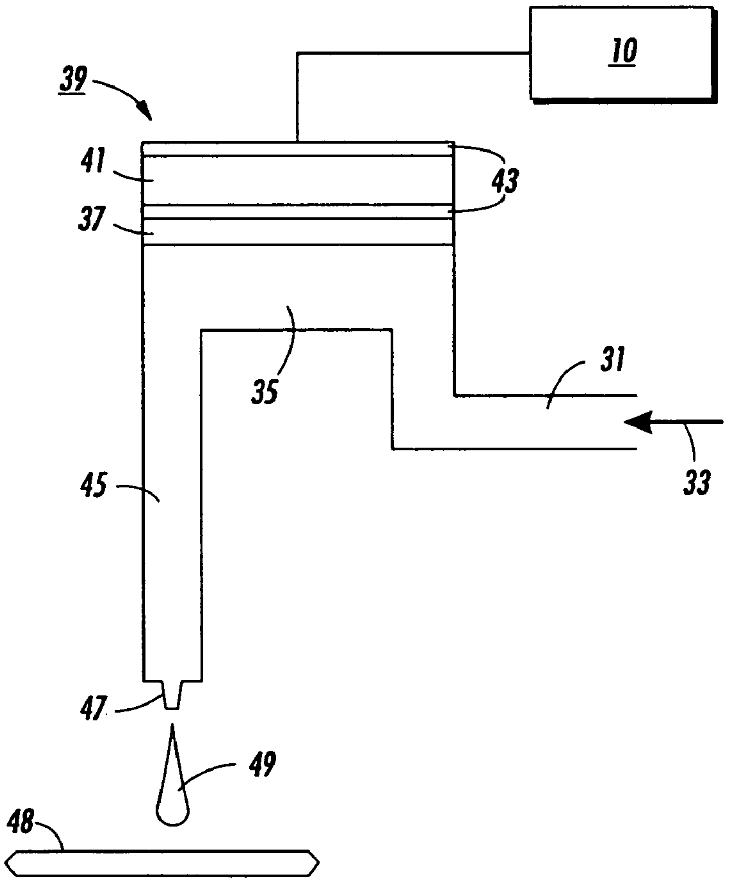
FIG. 2 is a schematic block diagram of an embodiment of a drop generator that can be employed in the drop emitting apparatus of FIG. 1.

FIG. 2 is a schematic block diagram of an embodiment of a drop generator 30 that can be employed in the printhead assembly 20 of the printing apparatus shown in FIG. 1. The drop generator 30 includes an inlet channel 31 that receives ink 33 from a manifold, reservoir or other ink containing structure. The ink 33 flows into an ink pressure or pump chamber 35 that is bounded on one side, for example, by a flexible diaphragm 37. An electromechanical transducer 39 is attached to the flexible diaphragm 37 and can overlie the pressure chamber 35, for example. The electromechanical transducer 39 can be a piezoelectric transducer that includes a piezo element 41 disposed for example between electrodes 43 that receive drop firing and non-firing signals from the controller 10. Actuation of the electromechanical transducer 39 causes ink to flow from the pressure chamber 35 through an outlet channel 45 to a drop forming nozzle or orifice 47, from which an ink drop 49 is emitted toward a receiver medium 48 that can be a transfer surface, for example.

The ink 33 can be melted or phase changed solid ink, and the electromechanical transducer 39 can be a piezoelectric transducer that is operated in a bending mode, for example.

Figure 3:
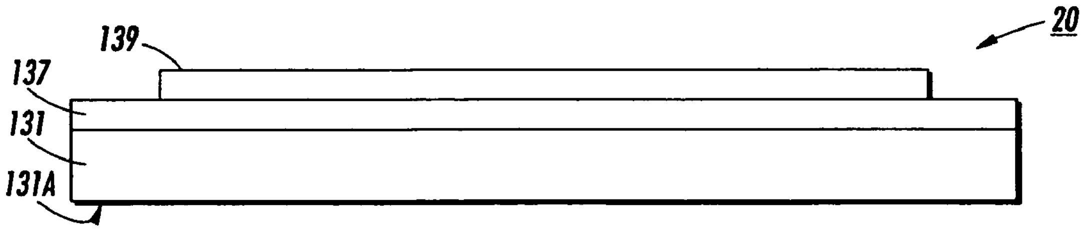
FIG. 3 is a schematic elevational view of an embodiment of an ink jet printhead assembly.

FIG. 3 is a schematic elevational view of an embodiment of an ink jet printhead assembly 20 that can implement a plurality of drop generators 30 (FIG. 2) as an array of drop generators. The ink jet printhead assembly includes a fluid channel layer or substructure 131, a diaphragm layer 137 attached to the fluid channel layer 131, and a transducer layer 139 attached to the diaphragm layer 137. The fluid channel layer 131 implements the fluid channels and chambers of the drop generators 30, while the diaphragm layer 137 implements the diaphragms 37 of the drop generators. The transducer layer 139 implements the piezoelectric transducers 39 of the drop generators 30. The nozzles of the drop generators 30 are disposed on an outside surface 131A of the fluid channel layer 131 that is opposite the diaphragm layer 137, for example.

By way of illustrative example, the diaphragm layer 137 comprises a metal plate or sheet such as stainless steel that is attached or bonded to the fluid channel layer 131. Also by way of illustrative example, the fluid channel layer 131 can comprise a laminar stack of plates or sheets, such as stainless steel.

Figure 4:
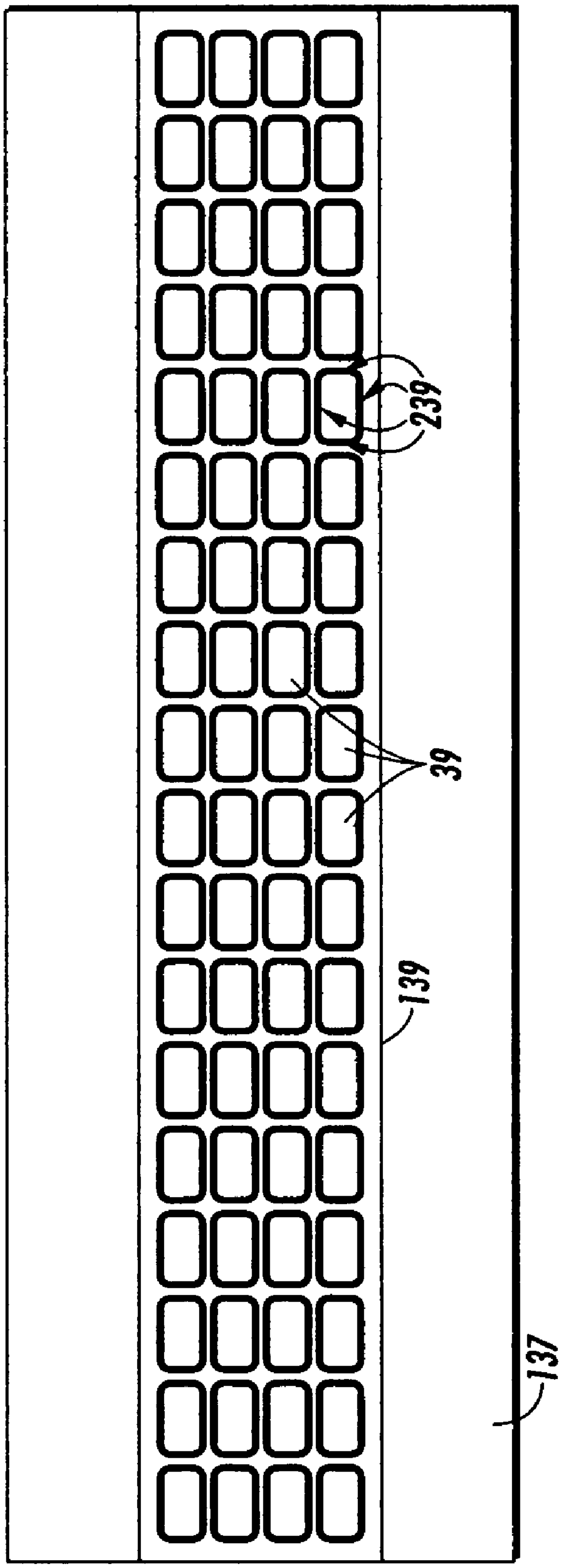
FIG. 4 is a schematic plan view of the ink jet printhead assembly of FIG. 3.

FIG. 4 is schematic plan view of an array of transducers 39 that can be implemented for an array of drop generators formed in the printhead assembly 20.

Figure 5:
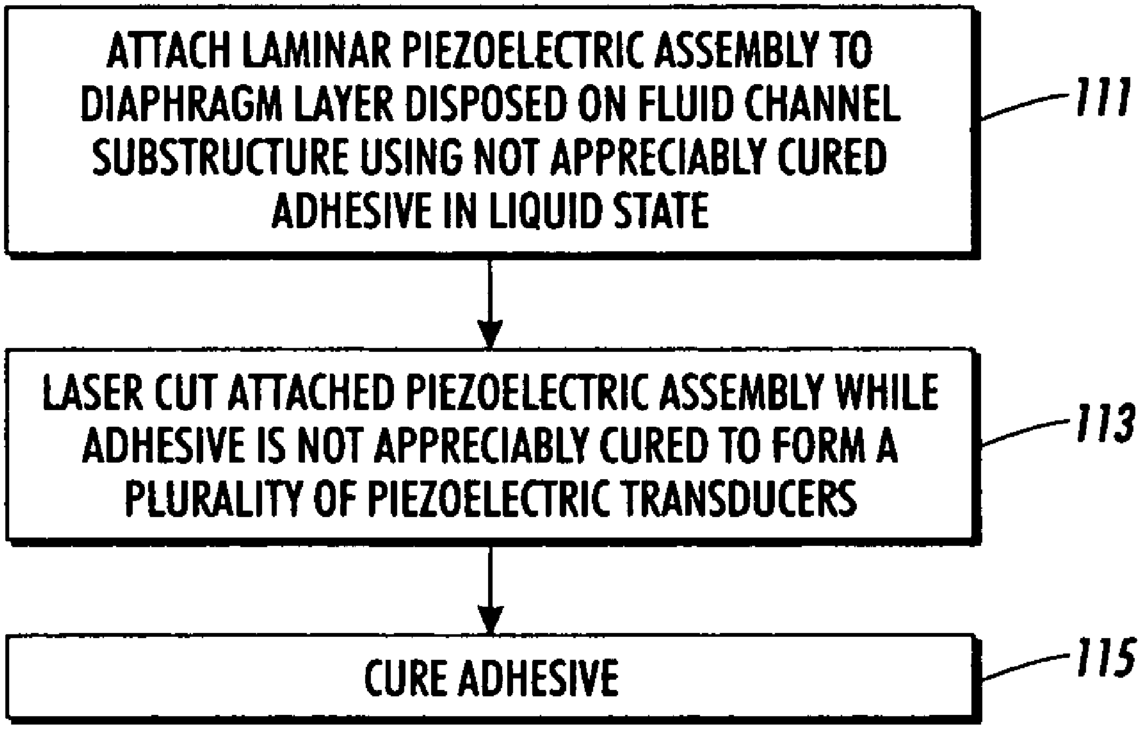
FIG. 5 is a schematic flow diagram of an embodiment of a procedure for making a plurality of electromechanical devices.

FIG. 5 is a schematic flow diagram of an embodiment of a procedure for making a plurality of transducers 39 or other electromechanical devices such as acoustic phased array transducers, micro-pumps, and actuation arrays for deformable mirrors.

At 111 a laminar piezoelectric assembly is attached to a diaphragm layer 137 disposed on a fluid channel substructure 131 using an uncured adhesive that is in a liquid state when not appreciably cured and moderate pressure, wherein the diaphragm layer 137 has been previously attached to the fluid channel substructure 131 to form a fluid channel/diaphragm substructure. The piezoelectric assembly can comprise a piezoelectric ceramic disposed between electrode layers. A slight amount of heat can also be employed to slightly lower the viscosity of the uncured adhesive. The pressure and heat are selected such that no appreciable curing takes place, whereby the adhesive remains not appreciably cured. By way of illustrative example, a layer of a not appreciably cured (e.g., substantially uncured) liquid epoxy adhesive can be applied to the diaphragm layer 137, and the laminar piezoelectric assembly is appropriately positioned on the not appreciably cured adhesive. The structure comprising the fluid channel substructure 131, the diaphragm layer 137 and the laminar piezoelectric assembly is placed in a press and can be heated. The structure is then allowed to cool to room temperature. In this manner, the laminar piezoelectric assembly remains attached at this point in the procedure by adhesive that is not appreciably cured, and maintains its position and is not readily displaced. The adhesive is not appreciably cured in the sense that the adhesive is not substantially fully cross-linked. More particularly, the cross-linking is sufficiently low such that the elastic modulus of the adhesive is sufficiently low that it will not support stresses associated with differences in thermal expansion that the piezoelectric assembly might be subjected to prior to the dicing discussed next. For convenience, the adhesive that is not appreciably cured can also be described as a substantially uncured adhesive.

At 113, while the adhesive is the state or condition of being not appreciably cured, the laminar piezoelectric assembly is cut or diced into a plurality individual piezoelectric transducers 39 by laser cutting, wherein kerfs 239 created by laser cutting electrically isolate the individual laser cut piezoelectric transducers 39, and wherein the individual laser cut piezoelectric transducers are formed in alignment with the associated pressure chambers 31 in the fluid channel substructure 131. The kerf cuts can be partially or completely through the laminar piezoelectric assembly. By way of illustrative example, cutting can be accomplished using multiple passes or scans of a laser beam produced by a diode pumped solid state laser at 355 nm, 532 nm, or 266 nm. A copper vapor laser, CO2 laser, YAG laser, or Vanadate laser can also be employed.

At 115 the adhesive between the diaphragm layer 137 and the plurality of piezoelectric transducers is cured, for example using heat and optionally pressure, as appropriate for the particular adhesive employed. For example, the structure comprising the fluid channel substructure 131, the diaphragm layer 137 and the plurality of piezoelectric transducers 39 can be placed in a heated press, and compressed and heated. For a suitably low viscosity and/or suitably high surface tension adhesive, surface tension may be sufficient to hold the piezoelectric heaters in place during curing such that pressure could be omitted.

By way of illustrative example, the adhesive employed can be one that comprises a viscous liquid at moderate temperatures, for example, under 100 degrees C., when substantially uncured or not appreciably cured. This allows placement of the laminar piezoelectric assembly on the diaphragm layer and having it stay in place during laser dicing, wherein the laminar piezoelectric assembly is attached to the diaphragm layer by an adhesive that is in a viscous liquid state. The adhesive can also be one that cures to a rigid polymer matrix having a relatively low modulus of elasticity.

Suitable classes of adhesives can include epoxies, phenolics, polyimides and bismaleimides.

Depending on the adhesive employed, curing temperatures can be in the range of about 100 degrees C. to about 200 degrees C. Some adhesives cure at lower or higher temperatures. Pressures can be from no pressure up to about 300 psi, or higher, for example. Adhesive cure conditions are commonly provided by the adhesive supplier.

In the foregoing procedure, curing the adhesive after the electromechanical devices are diced can avoid or reduce fracturing or cracking of the diced electromechanical devices. More generally, the laminar electromechanical structure is attached by an adhesive that is not appreciably cured such that laser dicing does not cause cracking.

The foregoing can advantageously provide for efficient manufacture of arrays of drop generators, and can provide for manufacture of assemblies having uncut laminar piezoelectric structures that can be transported to another location for laser cutting. It should be appreciated that the foregoing techniques can also be employed to make other electromechanical devices.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of forming a plurality of electromechanical devices comprising:

applying an adhesive in a liquid state and not appreciably cured to stainless steel substrate previously attached to a fluid channel substrate at a temperature that is below a cure temperature of the adhesive, wherein the adhesive comprises a liquid at a temperature below the cure temperature of the adhesive;

positioning a laminar piezoelectric structure on the adhesive while the adhesive is not appreciably cured, wherein the piezoelectric structure positioned against the stainless steel substrate forms an assembly;

heating the assembly at a temperature below the cure temperature of the adhesive while compressing the assembly to squeeze the adhesive into an adhesive layer such that the laminar piezoelectric structure is attached to the stainless steel substrate by an adhesive layer that is not appreciably cured;

after heating and compressing the assembly, cooling the assembly to room temperature;

individually laser cutting the pre-cured laminar piezoelectric structure being held against the stainless steel substrate by the adhesive layer, the cutting made in alignment with pressure chambers in the fluid channel substrate while the adhesive layer is not appreciably cured to form a plurality of electrically isolated piezoelectric devices; and, curing the adhesive layer of the assembly after laser cutting the laminar piezoelectric structure.

2. The method of claim 1 wherein applying an adhesive in a liquid state and not appreciably cured to a stainless steel substrate comprises applying a liquid epoxy adhesive that is not appreciably cured to a stainless steel substrate comprising a stack of metal plates.

3. The method of claim 1 wherein positioning a laminar piezoelectric structure comprises positioning a laminar piezoelectric structure on the adhesive.

4. The method of claim 1 wherein laser cutting the laminar piezoelectric structure comprises laser cutting the laminar piezoelectric structure using a scanned laser beam while the adhesive layer is not appreciably cured.

5. The method of claim 1 wherein:

positioning the laminar piezoelectric structure comprises positioning a laminar piezoelectric structure on the adhesive while the adhesive is not appreciably cured; and laser cutting the laminar piezoelectric structure comprises laser cutting the laminar piezoelectric structure using a scanned laser beam while the adhesive layer is not appreciably cured.

6. The method of claim 1 wherein curing the adhesive layer comprises heating the structure comprising the stainless steel substrate and the piezoelectric devices.

7. The method of claim 1 wherein curing the adhesive layer comprises:

compressing the structure comprising the stainless steel substrate and the piezoelectric devices in a press; and heating the structure comprising the stainless steel substrate and the piezoelectric devices.

8. A method of forming a plurality of piezoelectric transducers comprising:

attaching a laminar piezoelectric structure to a stainless steel substrate to form an assembly, the attaching performed using an adhesive in a viscous liquid state and not appreciably cured;

subsequent to attaching the assembly, laser cutting the laminar piezoelectric structure while the adhesive is not appreciably cured to form a plurality of piezoelectric transducers; and curing the adhesive after laser cutting the laminar piezoelectric structure.

9. The method of claim 8 wherein attaching a laminar piezoelectric structure using an adhesive in a viscous liquid state and not appreciably cured comprises attaching a laminar piezoelectric structure to a stainless steel substrate using an epoxy adhesive in a viscous liquid state.

10. The method of claim 8 wherein laser cutting the laminar piezoelectric structure while the adhesive is not appreciably cured comprises laser cutting the laminar piezoelectric structure using a scanned laser beam while the adhesive is not appreciably cured.

11. The method of claim 8 wherein curing the adhesive comprises heating the structure comprising the stainless steel substrate and the plurality of piezoelectric transducers.

12. The method of claim 8 wherein curing the adhesive comprises:

compressing the structure comprising the stainless steel substrate and the plurality of piezoelectric transducers; and heating the structure comprising the stainless steel substrate and the plurality of piezoelectric transducers.

13. A method of making an ink jet printhead, comprising:

applying an adhesive in a viscous liquid state to a stainless steel substrate at a temperature that is below a cure temperature of the adhesive;

positioning a laminar piezoelectric structure on the adhesive while the adhesive is in a viscous liquid state to form an assembly;

heating the assembly to a first temperature below a cure temperature of the adhesive;

laser cutting the laminar piezoelectric structure of the assembly while the adhesive layer is uncured in a viscous liquid state to form a plurality of electrically isolated piezoelectric devices; and curing the adhesive layer after laser cutting the laminar piezoelectric structure.

14. The method of claim 13 wherein applying an adhesive in a viscous liquid state to a stainless steel substrate comprises applying a viscous liquid epoxy adhesive to a stainless steel substrate comprising a stack of metal plates.

15. The method of claim 13 wherein positioning a laminar piezoelectric structure comprises positioning a laminar piezoelectric structure on the adhesive.

16. The method of claim 13 wherein laser cutting the laminar piezoelectric structure comprises laser cutting the laminar piezoelectric structure using a scanned laser beam while the adhesive layer is in a viscous liquid state.

17. The method of claim 1 wherein:

positioning a laminar piezoelectric structure comprises positioning a laminar piezoelectric structure on the adhesive while the adhesive is in a viscous liquid state; and laser cutting the laminar piezoelectric structure comprises laser cutting the laminar piezoelectric structure using a scanned laser beam while the adhesive layer is in a viscous liquid state.

* * * * *